US005535353A

United States Patent [19]

Tanabe et al.

[11] Patent Number: 5,535,353

[45] Date of Patent: Jul. 9, 1996

[54] ADDRESS GENERATING CIRCUIT FOR DATA COMPRESSION

[75] Inventors: Keiji Tanabe; Makoto Kikuchi, both of Tokyo, Japan

[73] Assignee: Ando Electric Co., Ltd., Tokyo, Japan

[21] Appl. No.: 74,096

[22] Filed: Jun. 8, 1993

[30] Foreign Application Priority Data

Jun. 30, 1992 [JP] Japan .................................... 4-196123

[51] Int. Cl.$^6$ .................................................... G06F 11/20

[52] U.S. Cl. ...................................... 395/421.1; 371/21.1

[58] Field of Search .................................... 395/400, 114, 395/115, 421.1; 365/201; 345/189, 190, 193, 200, 202; 371/21.1; 364/200 MS File, 900 MS File, DIG. 1, DIG. 2

[56] References Cited

U.S. PATENT DOCUMENTS 4,628,509 12/1986 Kawaguchi ............................ 371/21.1

4,965,751 10/1990 Thayer et al. .......................... 364/521

5,396,607 3/1995 Shimatani .............................. 395/400

*Primary Examiner*—Jack A. Lane

*Attorney, Agent, or Firm*—Panitch Schwarze Jacobs & Nadel

[57] ABSTRACT

An address generating circuit for data compression includes an X-address generating circuit (10), a Y-address generating circuit (20), an XY-address generation control circuit (30) and a defect analyzing memory (40). Each of the circuits (10) and (20) include a flip-flop (3A), a selector (2), an upcounter (4), an adder (5), a down-counter (6) and a comparator (1). The control circuit (30) receives address end signals J and address carry signals L from the circuits (10) and (20) to control the circuits (10) and (20). The memory (40) has address signals K from the circuits (10) and (20). Processing time required to check defects of a large capacity memory device is reduced because address generators are provided not only on the X-address side but also on the Y-address side and the compression ratio is set in the address generating circuit, thereby accelerating the defect analysis.

1 Claim, 5 Drawing Sheets

F I G. 1
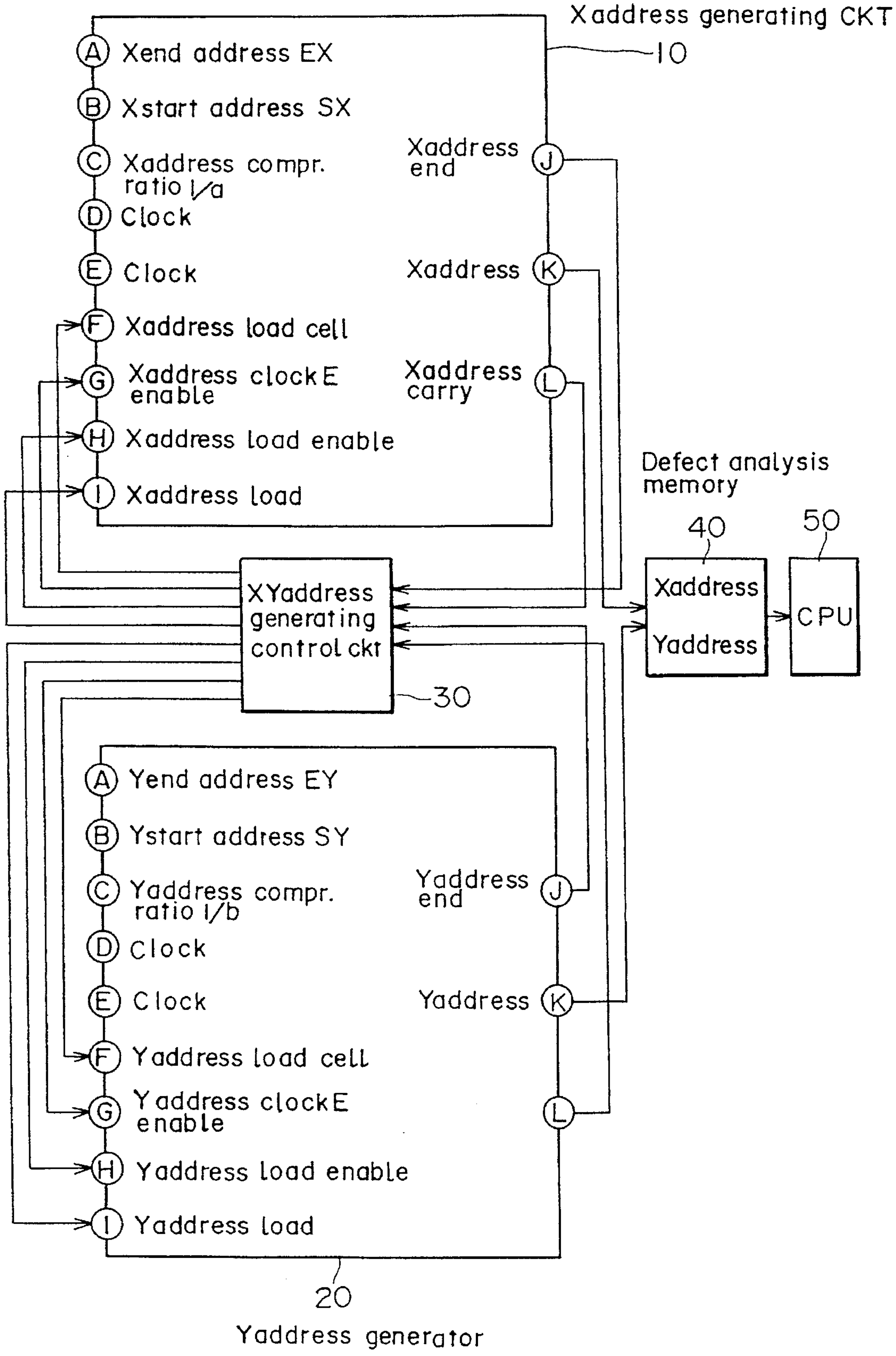

F I G. 3
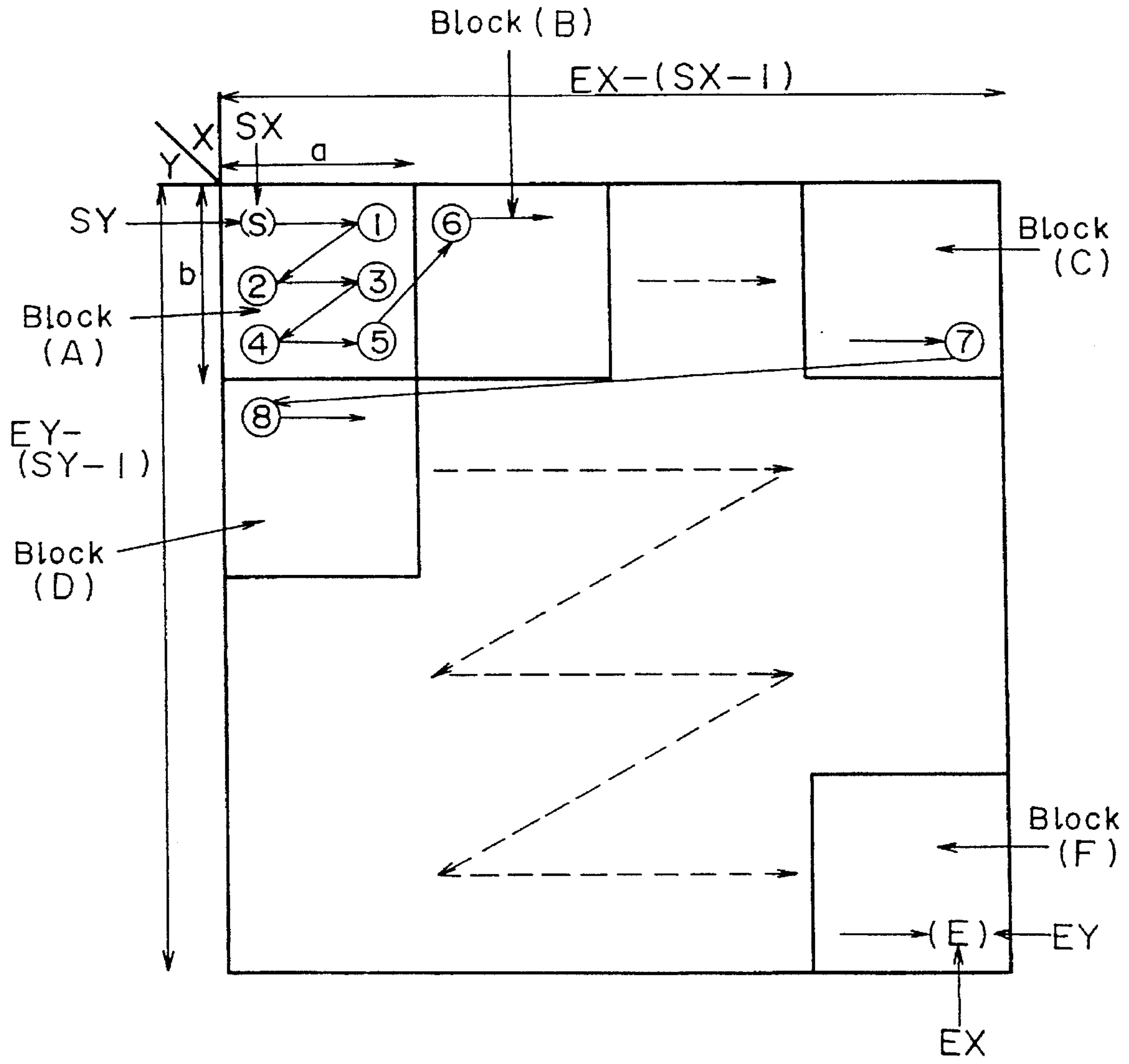

ADDRESS GENERATING CIRCUIT FOR DATA COMPRESSION

BACKGROUND OF THE INVENTION

1. Field of the Invention

The present invention relates to an address generating circuit for data compression which functions to read out data stored in a defect analyzing memory into a CPU with any desired compression ratio at a high speed.

2. Prior Art

According to the conventional technique data for all addresses stored in an error analyzing memory are read out into a CPU and thereafter they are converted into a corresponding compression ratio with help of a software.

The problem to be solved by the present invention As the conventional technique converts data using software, a long period of time is required not only for taking in all data but also for processing the data.

OBJECT OF THE INVENTION

Accordingly, a principal object of the invention is to solve this problem.

Another object of the present invention is to provide an improved address generator for data compression.

A further object of the present invention is to provide an improved address generator or data compression, which reduces access time to a CPU in performing a defect analysis of a large capacity memory device, by setting an address compression ratio by means of an address generating circuit so as to accelerate the defect analysis.

Means of solving the problem

To achieve these objects, the present invention provides an address generating circuit for data compression, which comprises an X-address generating circuit 10, a Y-address generating circuit 20, an XY-address generation control circuit 30 and a defect analyzing memory 40.

Each of the X-address generating circuit 10 and Y-address generating circuit 20 is comprised of a selector 2 for selecting either one of a start address signal B and an output of an adder 5 by an address load cell signal F, a flip-flop(FF) 3A for holding the selected signal from the selector 2, an up-counter 4 having as a load datum the datum held in the flip-flop 3A and generating an increment address, said adder 5 being for adding an address compression ratio signal C to the datum held in the flip-flop 3A, a down-counter 6 having as a load datum the address compression ratio signal C and operating simultaneously with said up-counter 4 to output an address carry signal L, a comparator 1 for comparing an end address A and the output of the up-counter 4 to detect a last address. The XY-address generation control circuit 30 receives as its inputs address end signals J and address carry signals L from both the X-address generating circuit 10 and Y-address generating circuit 20 to control the X-address generating circuit 10 and Y-address generating circuit 20.

The address generating circuit of the present invention further includes a defect analyzing memory 40 having as its addresses address signals K from the X-address generating circuit 10 and the Y-address generating circuit 20.

BRIEF DESCRIPTION OF THE DRAWINGS.

FIG. 1 is a block diagram of the address generating circuit for data compression according to the present invention;

FIG. 3 is an explanatory drawing for showing the operation of FIG. 1 as the movement of the addressed in the defect analyzing memory;

PREFERRED EMBODIMENT OF THE INVENTION

Figure 2:
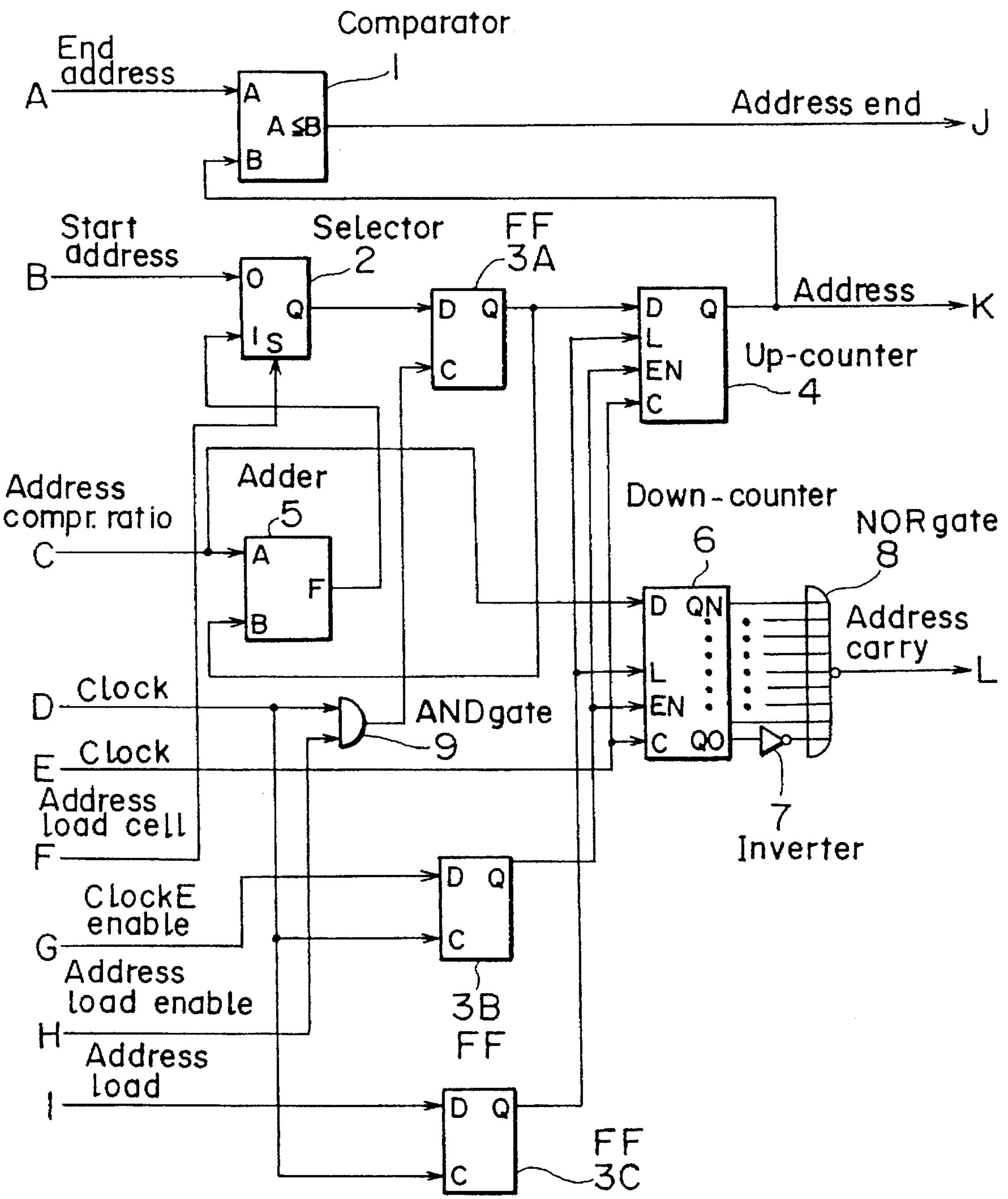
FIG. 2 is a block diagram of the X-address generating circuit 10 and Y-address generating circuit 20 of FIG. 1.

Next, the construction of the address generating circuit for data compression according to the present invention will now be explained in detail in to FIG. 1, wherein 10 is an X-address generating circuit, 20 is a Y-address generating circuit, 30 is an XY-address generation control circuit, 40 is a defect analyzing memory and 50 is a CPU. Each of the X-address generating circuit 10 and the Y-address generating circuit 20 is identical with address generating circuit illustrated in FIG. 2 which will be explained in detail below. That is, the system in FIG. 1 employs a pair of identical address generating circuits shown in FIG. 2, one being the X-address generating circuit 10 and the other being the Y-address generating circuit 20.

Assuming that a X-start address is SX, a Y-start address is SY, an X-address compression ratio is 1/a, a Y-address compression ratio is 1/b, an X-end address is EX and a Y-end address is EY. The XY-address generation control circuit 30 has as its inputs address end signals J and address carry signals L of the X-address generating circuit 10 and the Y-address generating circuit 20. Upon receipt of these inputs, the XY-address generation control circuit 30 controls the X-address generating circuit 10 and the Y-address generating circuit 20. The defect analyzing memory 40 has as its inputs the address signals K of the X-address generating circuit 10 and Y-address generating circuit 20.

Next, each of the detailed construction of the X-address generating circuit 10 and the Y-address generating circuit 20 of FIG. 1 will be explained in to FIG. 2, wherein 1 is a comparator, 2 is a selector, 3A~3C are flip-flops (FFs), 4 is an up-counter, 5 is an adder, 6 is a down-counter, 7 is an inverter, 8 is a NOR gate and 9 is an AND gate. A to I are signals on the input side and J, K, and L are signals on the output side.

The operation of the system of FIG. 2 will now be explained. The selector 2 receives a start address signal B and a datum calculated in the adder and selects either one of them by an address load cell signal F. The flip-flop 3A holds the signal selected by the selector 2. The datum held in the flip-flop 3A is used as a load datum in the up-counter 4.

The datum obtained from calculation by the adder 5 is a sum of an address compression ratio signal C and the datum held in the flip-flop 3A, the latter being also an input for the up-counter 4. The load datum to the up-counter 4 can be selected from either the start address signal B or the datum obtained by adding the previous load datum of the up-counter 4 to the address compression ratio C. This selection is controlled by an address load cell signal F.

The rewrite of the load datum in the flip-flop 3A is controlled by an address load enable signal H. The datum held in the hold circuit FF 3A is loaded into the up-counter 4 by an address load signal I and the counting-up operation of the up-counter 4 is controlled by a clock E and a clock E enable signal G. The output signal from the up-counter 4 becomes an address signal K which is controlled by the address generating circuit.

The down-counter 6 which is simultaneously operated with the up-counter 4 has as its load datum the address compression ratio signal C. The control method of the down-counter 6 is similar to that of the up-counter 4. The down-counter 6, the inverter 7 and the NOR gate 8 judges together as to whether the output datum is "1" or not and output an address carry signal L. This means that the down-counter 6 counts down the number of addresses corresponding to the address compression ratio signal C. The output signal of the up-counter 4 and the end address signal A are compared by the comparator 1 which, in turn, outputs an address end signal J at any address point.

The operation of the system illustrated in FIG. 1 will now be explained in FIG. 3, which shows the operation as a movement of addresses on the defect analyzing memory 40. In the flip-flops 3A of the X-address generating circuit 10 and Y-address generating circuit 20, X-start address SX and Y-start address SY are respectively held and data of these flip-flops 3A are loaded into the up-counters 4. As the X-address compression ratio is 1/a and the Y-address compression ratio is 1/b, the X-address compression ratio signal is "a" and the Y-address compression ratio signal is "b". These "a" and "b" valves are loaded into the down-counters 6, respectively. Therefore, the address (S) of FIG. 3 is now accessed.

Then, the X-address generating circuit 10 is incrementally advanced to the address ① of the block A of FIG. 3 and an X-address carry signal is outputted from the X-address generating circuit 10. Upon receipt of this signal, the XY-address generation control circuit 30 causes the X-address generating circuit 10 to load the up-counter 4 with the datum SX held in the flip-flop 3A and load the down-counter 6 with the X-address compression ratio signal a, and causes the Y-address generating circuit 20 to respectively incrementally advance the up-counter 4 and the down-counter 6 so that the address ② of FIG. 3 is now accessed.

This operation is repeated. When the address ④ of FIG. 3 is accessed, the Y-address generating circuit 20 outputs a Y-address carry signal and when the address ⑤ of FIG. 3 is accessed, the X-address generating circuit 10 outputs an X-address carry signal. Upon receipt of these two signals, the XY-address generation control circuit 30 causes the X-address generating circuit 10 to load the flip-flop 3A with a datum which is a sum of the address compression ratio signal a and a datum SX held in the flip-flop 3A and to load the up-counter 4 with the datum of the flip-flop 3A and the down-counter 6 with the X-address compression ratio signal a.

The Y-address generating circuit 20 loads the up-counter 4 with the datum SY held in the flip-flop 3A and the down-counter 6 with Y-address compression ratio signal b. Accordingly, the address ⑥ of FIG. 3 is now accessed. In a manner similar to the block A, the address is moved and when the address ⑦ of the block C of FIG. 3 is reached, an X-address carry signal, a Y-address carry signal and a X-address end signal are generated by the address generating circuits 10 and 20. Upon receipt of these three signals, the XY-address generation control circuit 30 causes the X-address generating circuit 10 to have the flip-flop 3A hold the X-start address SX, load the up-counter 4 with datum of the flip-flop 3A and the down-counter 6 with the X-address compression ratio a.

The Y-address generating circuit 20 loads the flip-flop 3A with a datum which is a sum of the address compression ratio signal b and the datum SY held in the flip-flop 3A, the up-counter 4 with the datum in the flip-flop 3A and the down-counter 6 with the Y-address compression ratio b. Accordingly, the address ⑧ of FIG. 3 is now accessed.

The above operation is repeated and the addresses are incrementally advanced until the address (E) in the block (F) is reached. When the address (E) is accessed, an X-address carry signal, an X-address end signal, a Y-address carry signal and a Y-address end signal are outputted. Upon receipt of these four signals, the control circuit 30 stops the incremental addressing operation. In this way, data at the "a" addresses of the X-addresses and the "b" addresses of the Y-addresses are taken from the defect analyzing memory 40 into the CPU 50.

Figure 4:
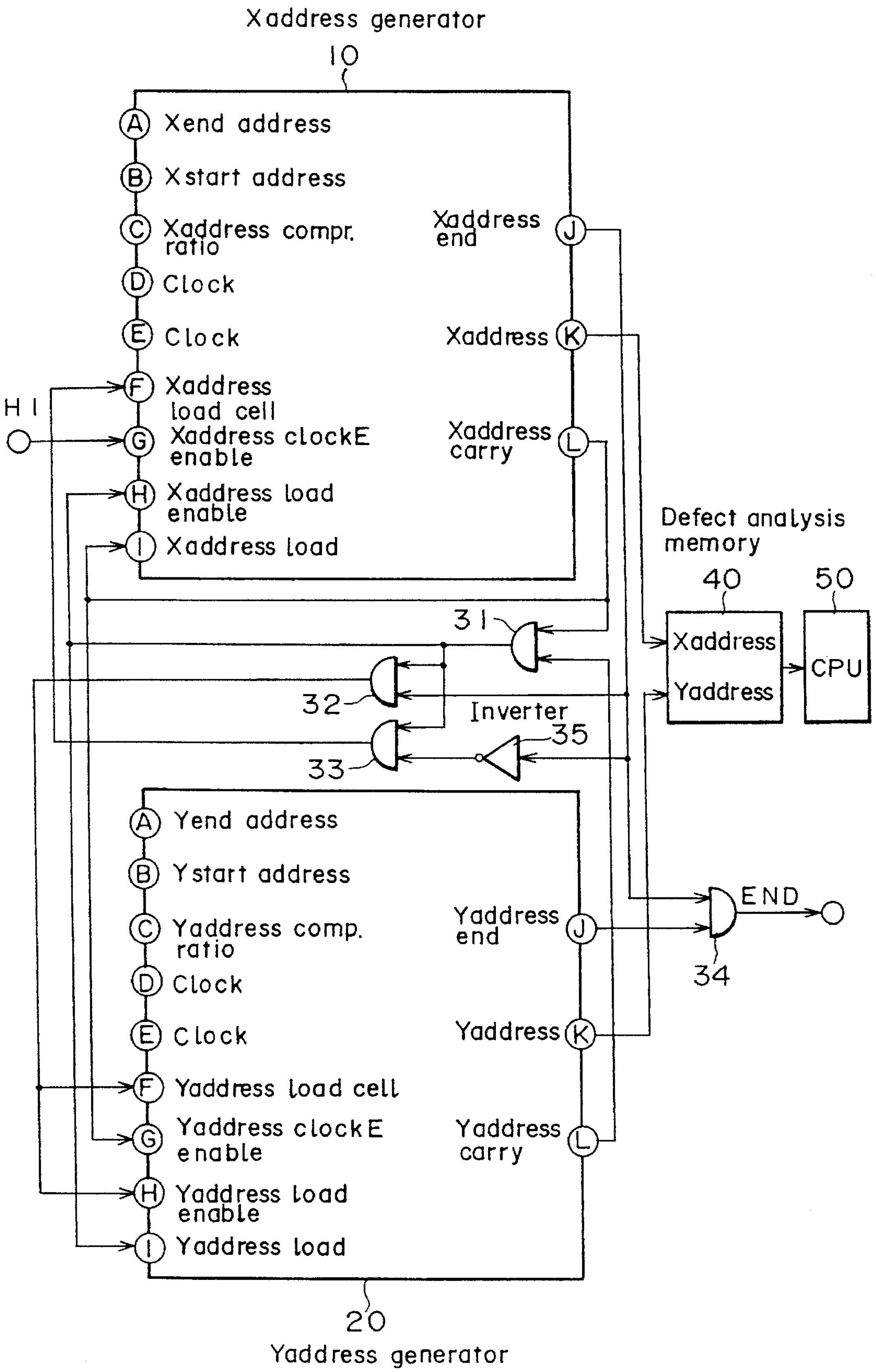
FIG. 4 is a block diagram of another embodiment of FIG. 1.

Next, one embodiment of FIG. 1 will be explained by making reference to FIG. 4, which illustrates an address generating circuit for data compression, wherein it is assumed that the X-start address is 0, the Y-start address is 0, the X-end address is 5, the Y-end address is 3, the X-address compression ratio is ⅓, and the Y-address compression ratio is ½. In FIG. 4, 31–34 are AND gates, 35 is an inverter and the other elements are similar to those in FIG. 1.

The fact that the X-address compression ratio is ⅓ and the Y-address compression ratio is ½ means that each block of three addresses of the X-addresses and two addresses of the Y-addresses comprises one address. The operation as depicted in FIG. 5 is realized by the address generating circuit for data compression illustrated in FIG. 4.

FIG. 4 shows an address generating circuit for data compression, wherein a control signal for the X-address generating circuit 10 and the Y-address generating circuit 20 is generated by an AND gate 31–34 and an inverter 35 from the X-address carry signal, X-address end signal, Y-address carry signal and Y-address end signal.

Figure 5:
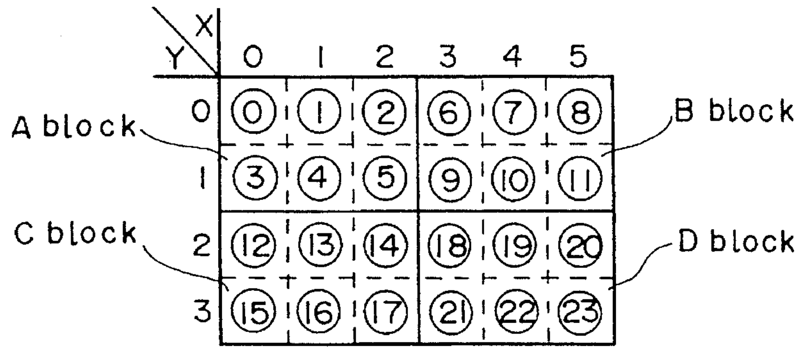
FIG. 5 is an explanatory drawing for the operation of FIG. 4.
Figure 6:
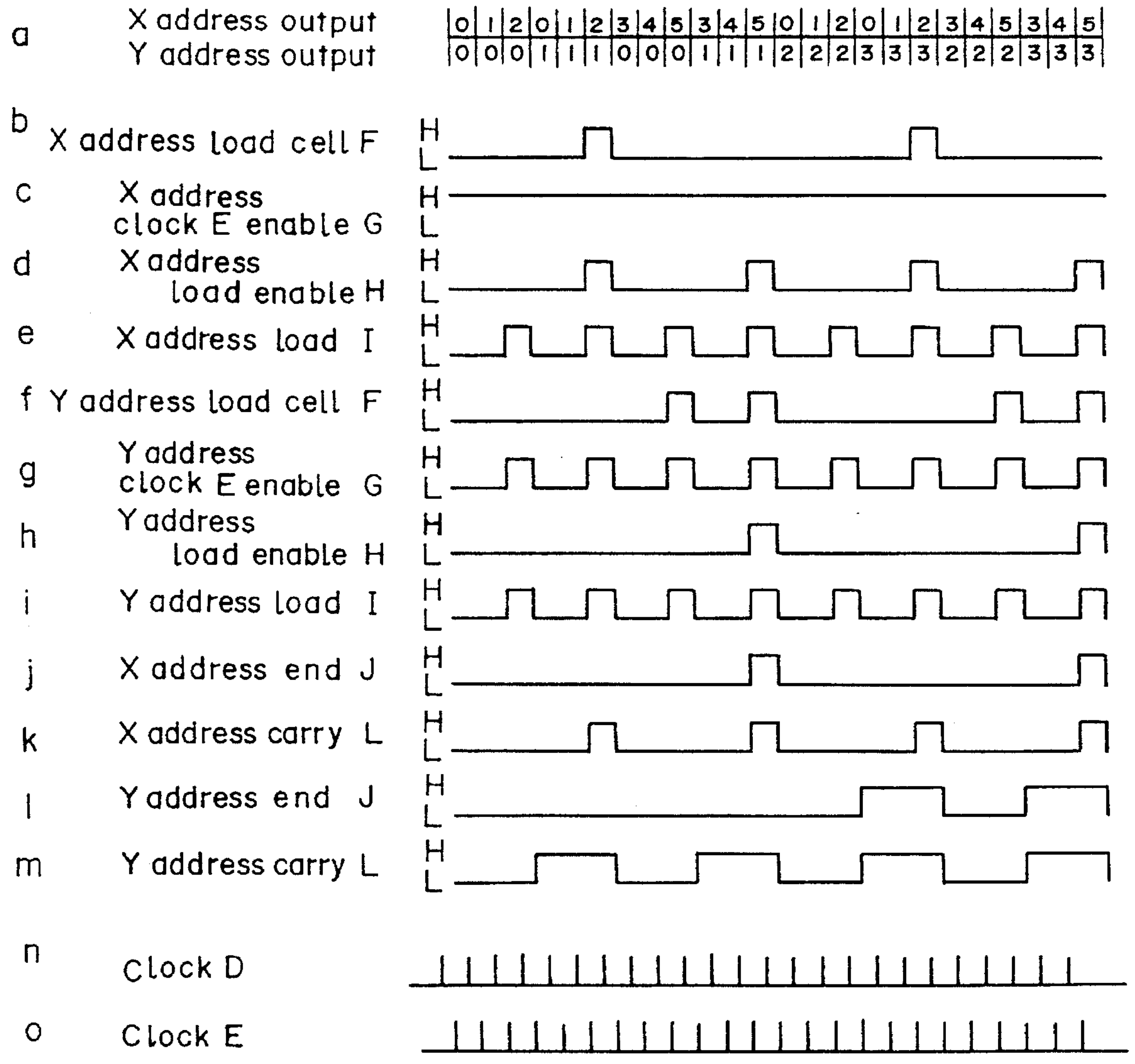
FIG. 6 is a timing chart of FIG. 4.

Timing charts of the system of FIG. 5 are shown in FIG. 6. In FIG. 6, (a) shows a relationship between the X-address output signal and the Y-address output signal. (b) to (o) will be explained in reference to FIG. 1. In FIG. 6, (b) to (e), (j) and (k) show the operation of the X-address generating circuit 10 and (f) to (i), (1) and (m) show the operation of the Y-address generating circuit 20. Also, in FIG. 6, (n) is a waveform of the clock D and (o) is a waveform of the clock E. As shown in FIG. 1, (j) to (m) in FIG. 6 are outputted with a timing of (o) in FIG. 6 and passed through the gate circuit in FIG. 4 so as to output signals having waveforms (b) to (i).

Effect of the invention

According to the present invention, when a large capacity memory device is to be subjected to the defect analysis, the processing time required to convert data in the CPU is reduced by the fact that address generators are provided not only on the X-address side but also on the Y-address side and the compression ratio is set in the address generating circuit, thereby accelerating the defect analysis.

We claim:

1. An address generating circuit for data compression, which comprises an X-address generating circuit (10), a Y-address generating circuit (20), an XY-address generation control circuit (30) and a defect analyzing memory (40);

each of said X-address generating circuit (10) and Y-address generating circuit (20) being comprised of a selector (2) for selecting either a start address signal B or an output of an adder (5), the selector (2) being under the direction of an address load cell signal F generated from the XY-address generation control circuit (30), a flip-flop (3A) for holding as a datum the selected signal from the selector (2), an up-counter (4) having as a load datum the datum held in the flip-flop (3A) and generating an incremental address K, said adder (5) adding an address compression ratio signal C to the datum held in the flip-flop (3A), a down-counter (6) having as a load datum the address compression ratio signal C and operating simultaneously with said up-counter (4) to output an address carry signal L, a comparator (1) for comparing an end address A and the incremental address K from the up-counter (4) to detect a last address end signal J;

said XY-address generation control circuit (30) having as inputs address end signals J and address carry signals L from both the X-address generating circuit (10) and Y-address generating circuit (20) to control the X-address address generating circuit (10) and Y-address generating circuit (20); and the defect analyzing memory (40) having as inputs address signals K from both the X-address generating circuit (10) and the Y-address generating circuit (20).

* * * * *